(12) United States Patent  (10) Patent No.: US 8,760,190 B1
Iyengar  (45) Date of Patent: Jun. 24, 2014

(54) EXTERNAL COMPONENT-LESS PVT COMPENSATION SCHEME FOR IO BUFFERS

(71) Applicant: LSI Corporation, Milpitas, CA (US)

(72) Inventor: Anuroop Iyengar, Bangalore, IN (US)

(73) Assignee: LSI Corporation, San Jose, CA (US)

( * ) Notice: Subject to any disclaimer, the term of this patent is extended or adjusted under 35 U.S.C. 154(b) by 19 days.

(21) Appl. No.: 13/706,110

(22) Filed: Dec. 5, 2012

(51) Int. Cl.
*H03K 17/16* (2006.01)
*H03K 19/003* (2006.01)

(52) U.S. Cl.
CPC .... *H03K 19/00369* (2013.01); *H03K 19/00346* (2013.01); *H03K 19/005* (2013.01)
USPC .................... 326/32; 326/21; 326/30; 326/33

(58) Field of Classification Search
None
See application file for complete search history.

(56) References Cited

U.S. PATENT DOCUMENTS

| | | | |
|---|---|---|---|
| 5,331,295 A * | 7/1994 | Jelinek et al. | .......... 331/57 |
| 5,498,977 A | 3/1996 | Pickup | |
| 7,321,254 B2 | 1/2008 | Li et al. | |
| 7,388,419 B2 | 6/2008 | Gk et al. | |
| 7,446,592 B2 | 11/2008 | Tripathi et al. | |
| 7,495,465 B2 | 2/2009 | Khan et al. | |
| 7,508,246 B2 | 3/2009 | Kase et al. | |
| 7,514,974 B2 | 4/2009 | Block et al. | |
| 2011/0057736 A1 | 3/2011 | Badillo | |
| 2012/0068762 A1 * | 3/2012 | Azimi et al. | .......... 327/540 |

FOREIGN PATENT DOCUMENTS

GB  2419050  4/2006

OTHER PUBLICATIONS

Sai-Weng Sing, He-Gong Wei, U-Fat Chio, Yan Zhu, Seng-Pan U, Rui Paulo Martins, Franco Maloberti, On-Chip Small Capacitor Mismatches Measurement Technique using Beat-Multiplier-Biased Ring Oscillator, Nov. 16-18, 2009, IEEE Asian Solid-State Circuits Conference, Taipei, Taiwan.
Andrey Malkov, Dmitry Vasiounin, Oleg Semenov, A Review of PVT Compensation Circuits for Advanced CMOS Technologies, Published Online Jul. 2011 (http://www.SciRP.org/journal/cs), Circuits and Systems, 2011, 2, 162-169.

* cited by examiner

*Primary Examiner* — Anh Tran
(74) *Attorney, Agent, or Firm* — Christopher P. Whitham; Cochran Freund & Young LLC

(57) ABSTRACT

Disclosed is a system and method for providing Process-Voltage-Temperature (PVT) compensation for an Input/Output interface. An embodiment may connect an analog section and a digital section together to generate and measure an oscillation frequency ($F_{OSC}$) used to look up a corresponding PVT control bit value in a look-up table. The analog section may be comprised of a voltage reduction system that reduces a bandgap reference voltage ($V_{BGR}$) to half the supplied $V_{BGR}$ to a current mirror that supplies a PVT current ($I_{PVT}$) to driver bit cells and a proportional mirrored control current ($I_{CNTL}$) to a current controlled oscillator (CCO), which generates $F_{OSC}$. The digital section may be used in combination with a frequency variable resistor and beta multiplier connected to the CCO to calibrate the capacitance of the CCO to tune out the process variation of the CCO capacitance and render FOSC to be linearly dependent on $I_{CNTL}$.

20 Claims, 7 Drawing Sheets

200 CIRCUIT ARCHITECTURE FOR AN EMBODIMENT OF THE PVT COMPENSATION CIRCUIT HAVING AN OP-AMP VOLTAGE REDUCTION & TRANSISTOR CURRENT MIRROR

EXTERNAL COMPONENT-LESS PVT COMPENSATION SCHEME FOR IO BUFFERS

BACKGROUND OF THE INVENTION

Input/Output (IO) for electronics and computing is typically described as the communication between some type of a processing system and the world outside of the subject processing system. The input of the IO refers to data/commands sent to the processing system from the outside world and the output of the IO refers to data/commands sent from the processing system to the outside world. The outside world simply refers to any entity not contained within the conceptual boundaries of the subject processing system. A processing system may be as small as a portion of a single chip or as large as networked group of computers, where the designation of the "processing system" is relative to what system is being designed. For instance, a computer integration specialist may look at each computer on a system as the "processing system," while an integrated circuit chip designer may look to an individual integrated circuit chip, or even individual subsystems within a particular integrated circuit as the "processing system" such that the chip or chip subsystem operates as its own "processing system" with IO to the outside world being IO to entities outside of the chip or even other subsystems contained on the same chip if the "processing system" is an individual subsystem of a particular chip.

An IO interface is necessary for the processor system to interact with the outside world. The IO interface provides the necessary logic to interpret addresses/commands issued by and/or sent to the processing system. A typical IO interface will implement some form of "handshaking" with the device/entity of the world outside of the processing system using commands such as busy, ready, and/or wait. Once "handshaking" to establish a connection is complete, a typical IO interface permits communication between the processing system and the world outside of the processing system. If different data formats are being exchanged, the IO interface typically performs the necessary conversion between the data formats to permit communication.

A typical integrated circuit chip is made up of individual electrical elements and typically includes active elements such as one or more transistor devices. Typical operation of a transistor requires connection of the transistors either directly or through other electrical devices to a high and a low output of a voltage supply. Typically, the high output of the voltage supply is identified as the high voltage supply and the low output of the voltage supply is identified as the low voltage supply. For an integrated circuit based on Metal-Oxide-Semiconductor Field-Effect Transistors (MOSFETs), it is common to refer to the high supply voltage as VDD (or VDDIO when a separate power supply is available for the IO interface) and to refer to the low supply voltage as VSS. Many if not most, times VSS is also referred to and defined as the electrical ground for a circuit. Typical operation of a MOSFET device involves the application of high (VDD) and or low (VSS) supply voltages to the gate, source, and/or drain either directly or through other electrical circuit devices. MOSFET devices are typically divided into two major subdivisions, PMOS devices and NMOS devices which have related, but different operational characteristics. While initially tied to MOSFET based circuits, the use of VDD and VSS to represent the high and low voltage outputs, respectively, has become common usage even for non-MOSFET based circuits.

SUMMARY OF THE INVENTION

An embodiment of the present invention may comprise a method to provide Process-Voltage-Temperature (PVT) compensation for an Input/Output (IO) interface, the IO interface having a bandgap reference voltage ($V_{BGR}$) and a reference frequency ($F_{REF}$), the method comprising: connecting the $V_{BGR}$ to a voltage reduction system; reducing the $V_{BGR}$ by substantially half at the voltage reduction system to produce $V_{BGR}/2$; connecting the $V_{BGR}/2$ to a current mirror system; connecting the current mirror system to a high supply voltage ($V_{DD}$); connecting a driver bit cell to a low supply voltage ($V_{SS}$); connecting the current mirror system to the driver bit cell such that a process-variable-temperature current ($I_{PVT}$) flows through the driver bit cell; connecting the current mirror system to a compensated current controlled oscillator; mirroring the $I_{PVT}$ at the current mirror system such that the compensated current controlled oscillator receives a control current ($I_{CNTL}$) that is proportional to the $I_{PVT}$; generating an oscillation frequency ($F_{OSC}$) at the compensated current controlled oscillator that is a function of the $I_{CNTL}$; connecting the $F_{OSC}$ to a digital system; connecting the $F_{REF}$ to the digital system; measuring, by the digital system, a desired count period based on $F_{REF}$; accumulating, by the digital system, a count of the $F_{OSC}$ at the digital system during the desired count period; looking up, by the digital system, a PVT control bit value that correlates to the accumulated count of the $F_{OSC}$ in a look-up table containing a predetermined correlation of potential count values of the $F_{OSC}$ to desired PVT control bit values; and providing, by the digital system, the looked up PVT control bit value to the IO interface.

An embodiment of the present invention may further comprise a Process-Voltage-Temperature (PVT) compensation system for an Input/Output (IO) interface, the IO interface having a bandgap reference voltage ($V_{BGR}$) and a reference frequency ($F_{REF}$), the PVT compensation system comprising: a voltage reduction subsystem connected to the $V_{BGR}$ that reduces the $V_{BGR}$ by substantially half to produce $V_{BGR}/2$; a driver bit cell connected to a current mirror subsystem and to a low supply voltage ($V_{SS}$); the current mirror subsystem connected to the $V_{BGR}/2$, to a high supply voltage ($V_{DD}$), to the driver bit cell, and to a compensated current controlled oscillator such that a process-variable-temperature current ($I_{PVT}$) flows through the driver bit cell and a mirrored control current ($I_{CNTL}$) that is proportional to the $I_{PVT}$ is delivered to the compensated current controlled oscillator; a compensated current controlled oscillator connected to the $I_{CNTL}$ that generates an oscillation frequency ($F_{OSC}$) that is a function of the $I_{CNTL}$; a digital subsystem that is connected to the $F_{OSC}$ and to the $F_{REF}$, and that measures a desired count period based on $F_{REF}$, accumulates a count of the $F_{OSC}$ during the desired count period, looks up a PVT control bit value that correlates to the accumulated count of the $F_{OSC}$ in a look-up table containing a predetermined correlation of potential count values of the $F_{OSC}$ to desired PVT control bit values, and provides the looked up PVT control bit value to the IO interface in order for the IO interface to set a buffer impedance of the IO interface in accord with the looked up PVT control bit value.

DETAILED DESCRIPTION OF THE EMBODIMENTS

As consumers demand more powerful computing in ever smaller packages, the data processing rate and interface speeds for electronic devices are, likewise, increasing to meet consumer expectations. As data processing rates and interface speeds increase, the sensitivity of the Input/Output (IO) interfaces of the electronics has also increased. Accordingly, many IO interfaces require a minimum variation of rise and fall times over process, voltage and temperature, often called Process-Voltage-Temperature or PVT. Many IO interfaces are integrated circuits that may contain Metal-Oxide-Semiconductor (MOS) devices, some of which may be MOS Field-Effect Transistors (MOSFETs). Typical MOS devices are made up of two classifications of devices, PMOS devices and NMOS devices, which have related, but different operational characteristics. One method to address the PVT concerns for an IO interface of an Integrated Circuit (IC), particularly an IC containing MOS devices, is to use a precision resistor external to the IO interface IC chip as a reference to calibrate buffer impedance of the IO interface. In the external precision resistor method for PVT compensation, a voltage drop across a compensating device within the IC chip (e.g., a PMOS or NMOS device) is compared to a known voltage drop across the external precision resistor. Based on the comparison between the known voltage across the external precision resistor and the compensating NMOS/PMOS device contained within the IC chip, the buffer impedance of the IO interface may be adjusted to correct any variations in voltage caused by PVT effects on the IC operation. The external precision resistor method of PVT compensation requires that the IC chip having the IO interface build in an external pin for connecting to the external precision resistor and that any systems incorporating the IC chip also leave space on the Printed Circuit Board (PCB) layout to accommodate the external precision resistor.

Figure 1:
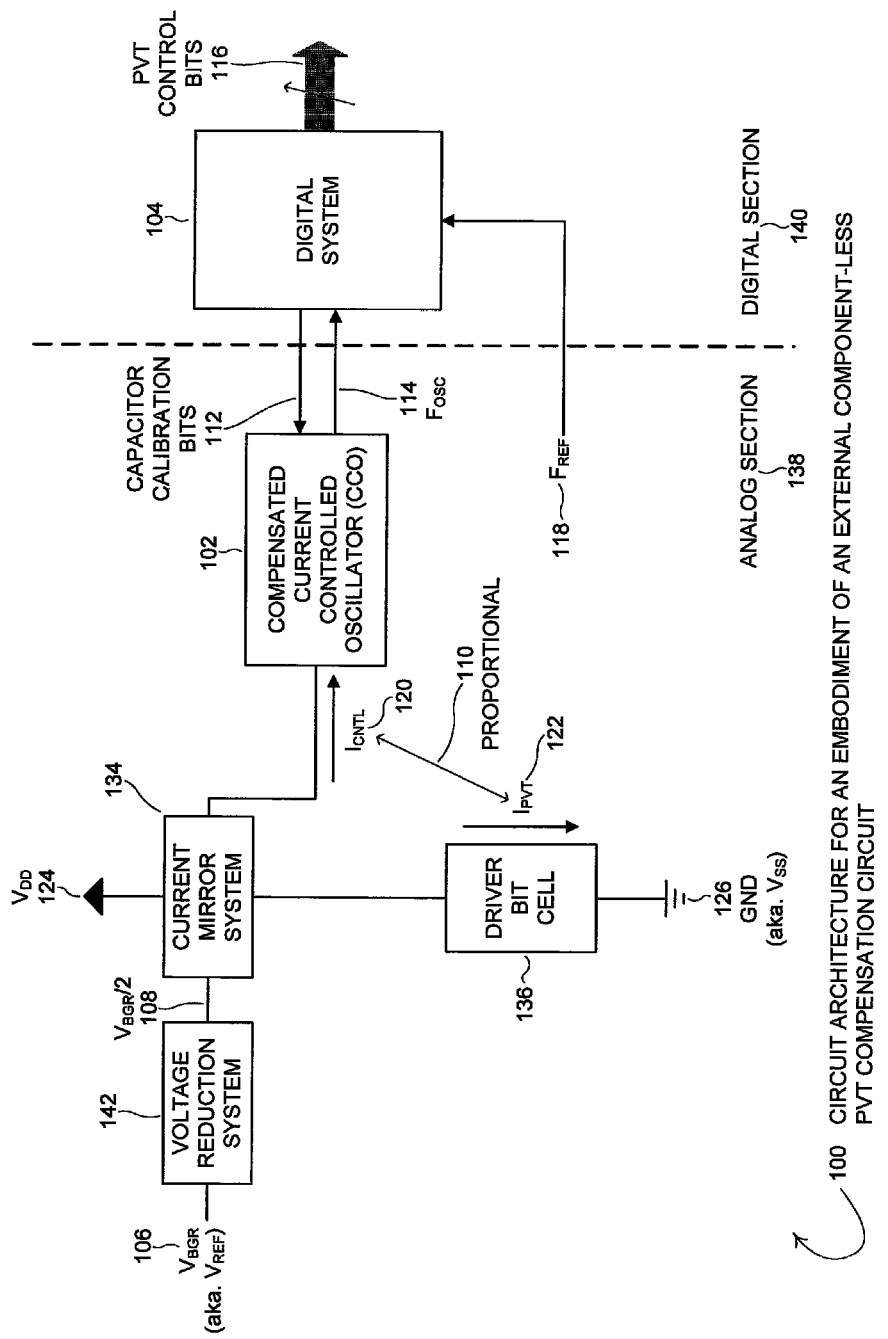
FIG. 1 is a circuit architecture block diagram of an external component-less Process-Voltage-Temperature (PVT) compensation circuit.

FIG. 1 is a circuit architecture block diagram of an external component-less Process-Voltage-Temperature (PVT) compensation circuit 100 for an IO interface. Notably, there is no need for an external precision resistor in the PVT compensation circuit 100 such that an embodiment may eliminate the pin used for connection to the external precision resistor in an IC chip package including an embodiment. Since the external precision resistor is not required, systems need not include space or traces on printed circuit boards to accommodate the now unneeded external precision resistor. Conceptually, an embodiment of the PVT compensation circuit may be split into an analog section/portion 138 and a digital section/portion 140. The analog section 138 generally works on analog principles to generate a frequency signal ($F_{OSC}$) 114 to deliver to the digital section 140. The digital section uses $F_{OSC}$ 114 to determine a PVT control bits value 116 that may be used by the IO interface to set a buffer impedance to mitigate potential PVT issues experienced by the overall IO interface circuitry. The overall IO interface circuit, as part of the standard aspects of an IO interface circuit, may make available a reference voltage ($V_{REF}$) 106, a high voltage supply ($V_{DD}$) 124, a low voltage supply/ground ($V_{SS}$) 126, and a reference frequency ($F_{REF}$) 118. The reference voltage ($V_{REF}$) 106 may be a Band Gap Reference voltage ($V_{BGR}$) of the IO interface circuit. While any reference voltage 106 may be used for an embodiment, for the embodiments discussed in this document, the reference voltage will be the bandgap reference voltage ($V_{BGR}$). Also note that various "systems" making up an embodiment may be referenced as a system (e.g., voltage reduction system 142, current mirror system 134, etc.) and/or may be referenced as a subsystem of the overall PVT compensation circuit (e.g., voltage reduction subsystem 142, current mirror subsystem 134, etc.). The choice of describing elements as a system or a subsystem does not affect the disclosed operation of the element, but is intended to permit a discussion in terms of the interaction of the various systems and/or to indicate that a system is a piece (i.e., a subsystem) of the overall PVT compensation system.

For the embodiment 100 shown in FIG. 1, in the analog section 138, $V_{BGR}$ 106 is connected to an input of a voltage reduction system 142. The voltage reduction system 142 reduces the voltage to substantially half of $V_{BGR}$ 108, or $V_{BGR}/2$ (108). The voltage reduction system may be any type of voltage reduction circuitry including an op-amp loop with an appropriate gain and a standard voltage divider circuit. The voltage reduction system 142 makes $V_{BGR}/2$ (108) available at an output of the voltage reduction system 142. $V_{BGR}/2$ (108) is connected to an input of the current mirror system 134. The current mirror system 134 also connects a high supply voltage connection point to the high supply voltage ($V_{DD}$) 124 of the overall IO interface circuit. The current mirror system 134 further connects a primary current output to one end of a driver bit cell 136 with the other end of the driver bit cell 136 connected to the low supply voltage/ground ($V_{SS}$) 126. Accordingly, a current 122 flows from $V_{DD}$ 124 to $V_{SS}$/ground 126 through the driver bit cell 136. The driver bit cell 136 may affect the current 122 in a manner that reflects the overall PVT effects on the IO interface circuit for variations of the current 122 flowing through the driver bit cell 136. Consequently, the current 122 flowing through the driver bit cell 136 may be referred to as the PVT current ($I_{PVT}$) 122. The current mirror system 134 also has a mirrored current output that is connected to the compensated current controlled oscillator (CCO) 102. The mirrored current output provides a mirrored current 120 that is proportional 110 to $I_{PVT}$ 122. The mirrored current 120 may then be used by an embodiment to control the oscillation frequency of the CCO 102 connected to the mirrored current, so the mirrored current 120 may be referred to as the control current ($I_{CNTL}$) 120. To ease confusion in creating the system, it may be desirable for the current mirror system 134 to mirror $I_{PVT}$ 122 to $I_{CNTL}$ 120 on a one-to-one proportional 110 basis. The CCO 102 changes frequency with changes in $I_{CNTL}$ 120 to produce oscillations at a frequency ($F_{OSC}$) 114 dependent on $I_{CNTL}$ 120. The CCO 102 delivers the $F_{OSC}$ 114 signal to the digital section 140, and the digital system 104 in particular of the digital section 140. The digital system 104 may also perform calculations to calibrate capacitance of the CCO 102 in order to remove process variation of comb/fringe capacitors that make up the CCO 102. The digital system 104 may deliver the calibration values to the CCO 102 as capacitor calibration bits 112 such that the CCO 102 would be beneficially implemented as a digitally tunable CCO 102.

The digital system 104 represents the digital section 140 of the embodiment of the PVT compensation circuit 100 shown in FIG. 1. The digital system 104 need only be a processing circuit element and associated memory capable of performing the operations described herein. The processing and memory elements may be implemented as a single logical circuit and/or individual processing and/or memory elements may be implemented in multiple circuits and combined together to provide the necessary processing and memory features to perform the necessary operations for the digital section 140 of an embodiment.

As also described above, the digital system 104 has an input that receives $F_{OSC}$ 114 from the CCO 102 and an output that delivers capacitor calibration bits 112 to the CCO 102. The digital system also has an input to receive a reference (i.e., known) frequency ($F_{REF}$) 118 that is typically available from the overall IO interface circuit as the output of a crystal oscillator or a PLL (Phase Locked Loop) clock input with a definite jitter specification, which is already a part of the overall product that is adding an embodiment of the external component-less PVT compensation system. The digital system 104 may use $F_{REF}$ 118 to measure a desired count period to accumulate a count of $F_{OSC}$ 114 oscillations in order to determine a frequency of FOSC 114 based on the known frequency of $F_{REF}$ 118. That is, since $F_{REF}$ 118 is known, a period may be measured by a number of oscillations of $F_{REF}$ 118, and a count of oscillations of $F_{OSC}$ 114 accumulated by the digital system 104 during the known time period may then be divided by the known period time value to obtain the actual frequency of $F_{OSC}$ 114. The digital system may then compare (in a comparator processor operation) the Fosc 114 generated by the CCO to a range of $F_{OSC}$ 114 values determined by simulation to represent operation of the IO interface from slow to nominal to fast process corners. Further, an embodiment may also advantageously eliminate the calculation of the actual $F_{OSC}$ 114 and simply use the accumulated count value of $F_{OSC}$ 114 measured by the digital system since the actual $F_{OSC}$ 114 and the accumulated count value are linearly dependent on each other and the division calculation is, therefore, unnecessary processing. However, if a system were to add the element of calculating the actual frequency of $F_{OSC}$ 114, the system would still be an embodiment since the calculation of actual frequency does not provide a meaningful difference from the count value accumulated by the digital system 104.

A correlation between $F_{OSC}$ 114 count values and desired buffer impedance to correct for PVT for the IO interface may be established based on a simulation, or even an actual empirical test, of the IO interface circuit from the slow to fast process corners of the IO interface. The buffer impedance of the IO interface may be represented as PVT control bits 116 provided to the IO interface by the digital system 104. Consequently, the correlation between $F_{OSC}$ 114 count values and buffer impedance may be established as a correlation between $F_{OSC}$ 114 and PVT control bit values 116. The correlation between $F_{OSC}$ 114 count values and PVT control bit values 116 may then be put into a look-up table that is stored as a predetermined look-up table in the digital system 104. The digital system 104 may then use the count of $F_{OSC}$ 114 oscillations accumulated during a desired count period as an input to the look-up table to obtain a correlating PVT control bit value 116 to provide to the overall IO interface so the IO interface may adjust the buffer impedance of the IO interface accordingly.

The process of obtaining the look-up table values may include simulating operation of the CCO 102 and the associated $F_{OSC}$ 114 from a slow process corner to a fast process corner in discrete steps (such as a single change in the accumulated count value of $F_{OSC}$ 114) that correlates each count in a range of accumulated counts for a desired count period. Each count in the range of accumulated counts may then be correlated to a desired PVT control bit value 116 and the correlated accumulated count values of $F_{OSC}$ 114 and the associated PVT control bit value 116 for the range of accumulated count values may be stored in the look-up table used by the digital system to determine PVT control bit values 116 based on the current accumulated count measured for $F_{OSC}$ 114.

Since it is desirable to implement all aspects of an embodiment on the IC chip needing PVT compensation, it is desirable to implement the CCO 102 efficiently. Further, it is desirable for the operation of an embodiment to ensure that the CCO 102 is linearly dependent on $I_{CNTL}$ 120 (and hence on $I_{PVT}$ 122 since $I_{CNTL}$ 120 is simply a proportional 110 mirror of $I_{PVT}$ 122). The CCO 102 may be implemented using a current starved approach where all MOS devices in an embodiment of the external component-less PVT compensation system are kept in saturation. The CCO 102 capacitances may be comb/fringe capacitors implemented using multi-layer metal structures that have negligible voltage and temperature coefficients. Typical current technology for the comb/fringe capacitors exhibits a process variation of +/−17% across three process corners (nominal, low, and high). A CCO 102 for an embodiment may then be comprised of a "self-calibrating" ring oscillator with a well defined, but digitally tunable ring structure (see the disclosure with respect to FIG. 3 for more information). Under the current starved/saturation condition, the frequency of oscillation $F_{OSC}$ 114 of the CCO 102 may be given by Eq. 1 below where $\lambda_P$ and $\lambda_N$ represent the channel length modulation parameters for PMOS and NMOS devices, respectively, in the CCO 102, and $C_P$ represents the parasitic capacitance at the output of a unit-delay cell in the oscillator.

$$F_{OSC} = \frac{(\lambda_P + \lambda_N) * I_{CNTL}}{12} * \text{mod}\left(\tan\left(60° - \frac{2\pi \kappa_{CCO}}{3}\right)\right), \quad \text{Eq. 1}$$

where $$K_{CCO} = \frac{\sqrt{3}(\lambda_P + \lambda_N)}{12\pi C_P} \quad \text{Eq. 2}$$

To achieve the desired PVT compensation for an embodiment it is desirable to make the PVT of the CCO 102 independent of $\lambda_P$, $\lambda_N$, and $C_P$. To make the PVT of the CCO independent of $\lambda_P$, $\lambda_N$, and $C_P$, an embodiment may "tune" the CCO 102 to take out the process variation of the comb/fringe capacitors making up the CCO 102. See the disclosure with respect to FIG. 3 below for a more detailed discussion of the tuning/calibration of the CCO 102 capacitance ($C_L$) for an embodiment. With the CCO 102 $C_L$ tuned to eliminate process variation of the comb/fringe capacitors of the CCO 102, the frequency of oscillation $F_{OSC}$ 114 of the CCO may be given by Eq. 3 below.

$$F_{OSC} = K_{CCO} * I_{PVT},\qquad \text{Eq. 3}$$

where $$K_{CCO} = \frac{\sqrt{3}\,(\lambda_P + \lambda_N)}{12\pi C_L}\qquad \text{Eq. 4}$$

The effect of $\lambda_P$ and $\lambda_N$ may be digitally subtracted out from the accumulated count value by the digital system 104. With $\lambda_P$ and $\lambda_N$ removed and the CCO 102 tuned to substantially remove process variation from the comb/fringe capacitors $C_L$ of the CCO 102 and with sufficiently granular values of $I_{PVT}$ (such as the discrete steps representing accumulated count values), the CCO 102 output frequency $F_{OSC}$ 114 is substantially linearly dependent on the input $I_{CNTL}$ 120 (and accordingly on $I_{PVT}$ 122). The digital system 102 accumulates a count of $F_{OSC}$ 114 oscillations in a counter and feeds the accumulated count to the count/PVT bit value look-up table stored on the digital system 104 to obtain a PVT bit value 116 that corresponds to the current $F_{OSC}$ 114. The entries in the look-up table may consist of a count forming a range from 1 to N corresponding to the variations from the slow to fast process corner in discrete steps. The step size may be determined by the desired number of PVT control bits 116 needed to achieve acceptable spread in the buffer impedance of the IO interface. A Finite State Machine (FSM) may be used to control the calibration of the CCO 102 at device boot-up/power up, and at subsequent times during operation.

Figure 2:
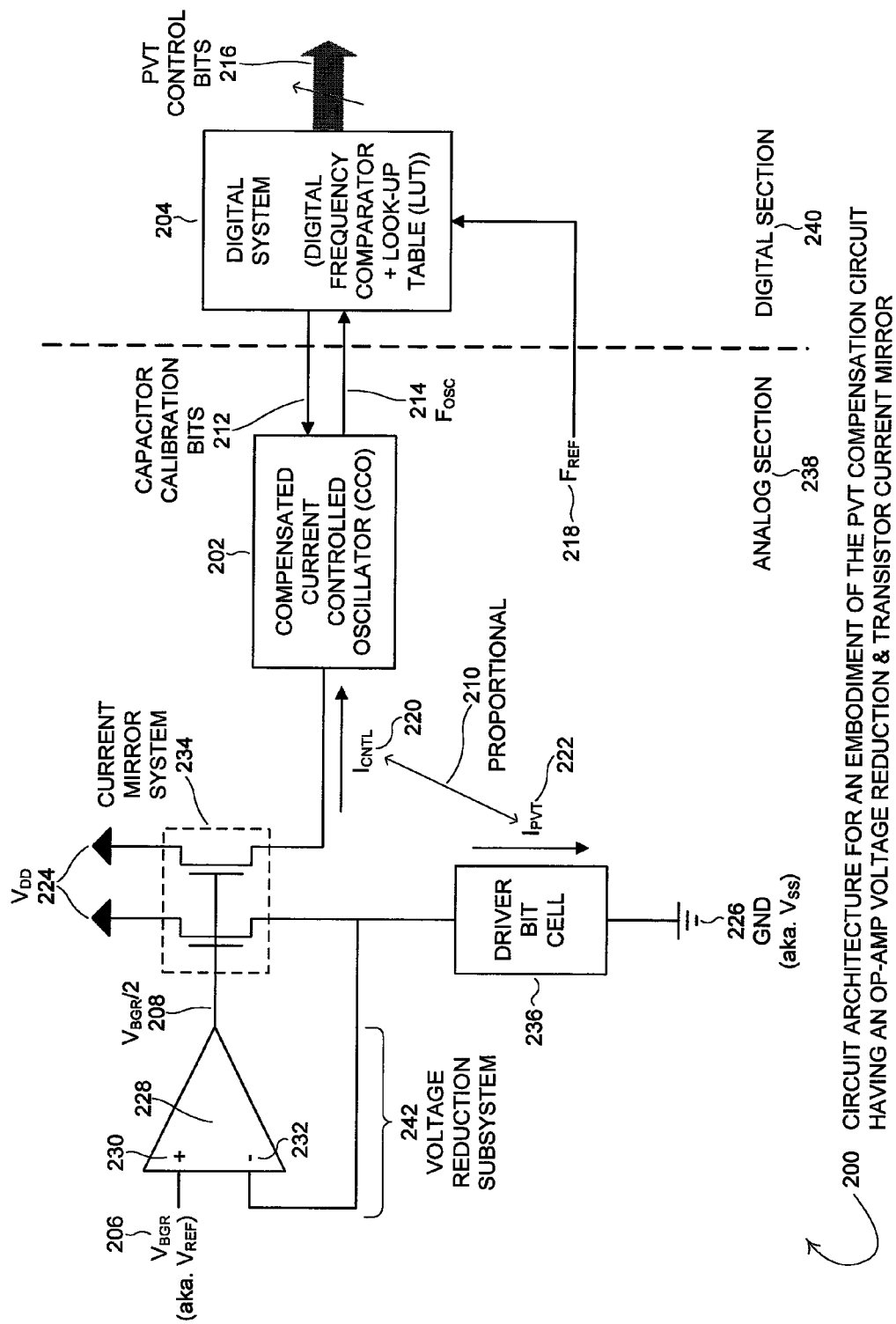
FIG. 2 is a circuit architecture block diagram of an external component-less Process-Voltage-Temperature (PVT) compensation circuit having an op-amp based voltage reduction system and a transistor based current mirror system.

FIG. 2 is a circuit architecture block diagram of an external component-less Process-Voltage-Temperature (PVT) compensation circuit 200 having an op-amp 228 based voltage reduction system 242 and a transistor based current mirror system 234. As for the embodiment shown in FIG. 1, conceptually, an embodiment of the PVT compensation circuit may be split into an analog section/portion 238 and a digital section/portion 240. Again, the analog section 238 generally works on analog principles to generate a frequency signal ($F_{OSC}$) 214 to deliver to the digital section 240. The digital section uses $F_{OSC}$ 214 to determine a PVT control bits value 216 that may be used by the IO interface to set a buffer impedance to mitigate potential PVT issues experienced by the overall IO interface circuitry. The overall IO interface circuit, as part of the standard aspects of an IO interface circuit, may make available a reference voltage ($V_{REF}$) 206, a high voltage supply ($V_{DD}$) 224, a low voltage supply/ground ($V_{SS}$) 226, and a reference frequency ($F_{REF}$) 218. The reference voltage ($V_{REF}$) 206 may be a Band Gap Reference voltage ($V_{BGR}$) of the IO interface circuit.

For the embodiment 200 shown in FIG. 2, in the analog section 238, the voltage reduction system is comprised of an op-amp loop made up of an operational amplifier 228 having various connections. $V_{BGR}$ 206 is connected to a positive input 230 of the operational amplifier 228. The connection between the current mirror system 234 and the driver bit cell 236 is also connected to loop back to the negative input 232 of the operational amplifier 228 of the voltage reduction system 242. The gain of the operational amplifier 228 may be set to reduce the voltage at the output of the operational amplifier to substantially half of $V_{BGR}$ 108, or $V_{BGR}/2$ (108). $V_{BGR}/2$ (108) is connected to an input of the current mirror system 134. In the embodiment shown in FIG. 2, the current mirror system 234 is comprised of MOSFET devices indicating that the current mirror system 234 is a MOS based current mirror circuit 234. Other types of current mirror systems may be available, but using MOS in a primarily CMOS based IC is desirable. The current minor system 234 also connects a high supply voltage connection point of the current mirror system 234 to the high supply voltage ($V_{DD}$) 224 of the overall IO interface circuit for each shown MOS device. The current minor system 234 further connects a primary current output to one end of a driver bit cell 236 with the other end of the driver bit cell 236 connected to the low supply voltage/ground ($V_{SS}$) 226. Accordingly, a current 222 flows from $V_{DD}$ 224 to $V_{SS}$/ground 226 through the driver bit cell 236. The driver bit cell 236 may affect the current 222 in a manner that reflects the overall PVT effects on the IO interface for the variations of the current 222 flowing through the driver bit cell 236. Consequently, the current 222 flowing through the driver bit cell 236 may be referred to as the PVT current ($I_{PVT}$) 222. The current mirror system 234 also has a mirrored current output that is connected to the compensated current controlled oscillator (CCO) 102. The mirrored current output provides a mirrored current 220 that is proportional 210 to $I_{PVT}$ 222. The mirrored current 220 may then be used by an embodiment to control the oscillation frequency of the CCO 202 connected to the mirrored current, so the mirrored current 220 may be referred to as the control current ($I_{CNTL}$) 220. The CCO 202 changes frequency with changes in $I_{CNTL}$ 220 to produce oscillations at a frequency ($F_{OSC}$) 214 dependent on $I_{CNTL}$ 220. The CCO 202 delivers the $F_{OSC}$ 214 signal to the digital section 240, and the digital system 204 in particular of the digital section 240. The digital system 204 may also perform calculations to calibrate capacitance of the CCO 202 in order to remove process variation of comb/fringe capacitors that make up the CCO 202. The digital system 104 may deliver the calibration values to the CCO 202 as capacitor calibration bits 212 such that the CCO 202 would be beneficially implemented as a digitally tunable CCO 202.

The digital system 204 represents the digital section 240 of the embodiment of the PVT compensation circuit 200 shown in FIG. 2. The digital system 204 need only be a processing circuit element and associated memory capable of performing the operations described herein. The processing and memory elements may be implemented as a single logical circuit and/or individual processing and/or memory elements may be implemented in multiple circuits and combined together to provide the necessary processing and memory features to perform the necessary operations for the digital section 240 of an embodiment.

As also described above, the digital system 204 has an input that receives $F_{OSC}$ 214 from the CCO 202 and an output that delivers capacitor calibration bits 212 to the CCO 202. The digital system also has an input to receive a reference (i.e., known) frequency ($F_{REF}$) 218 that is typically available from the overall IO interface circuit. The digital system 204 may use $F_{REF}$ 218 to measure a desired count period to accumulate a count of $F_{OSC}$ 214 oscillations in order to determine a frequency of $F_{OSC}$ 214 based on the known frequency of $F_{REF}$ 218. That is, since $F_{REF}$ 218 is known, a period may be measured by a number of oscillations of $F_{REF}$ 218, and a count of oscillations of $F_{OSC}$ 214 accumulated by the digital system 204 during the known time period may then be divided by the known period time value to obtain the actual frequency of $F_{OSC}$ 114. The digital system may then compare (in a comparator processor operation) the $F_{OSC}$ 114 generated by the CCO to a range of $F_{OSC}$ 114 values determined by simulation to represent operation of the IO interface from slow to nominal to fast process corners. Further, an embodiment may also advantageously eliminate the calculation of the actual $F_{OSC}$ 214 and simply use the accumulated count value of $F_{OSC}$ 124 measured by the digital system since the actual $F_{OSC}$ 214 are linearly dependent on each other and the division calculation is, therefore, unnecessary processing. However, if a system were to add the element of calculating the actual frequency of $F_{OSC}$ 214, the system would still be an embodiment since the calculation of actual frequency does not provide a meaningful difference from the count value accumulated by the digital system 204.

A correlation between $F_{OSC}$ 214 count values and desired buffer impedance to correct for PVT for the IO interface may be established via simulation, or even by empirical test, of the IO interface circuit from the slow to fast process corners of the IO interface. The buffer impedance of the IO interface may be represented as PVT control bits 216 provided to the IO interface by the digital system 204. Consequently, the correlation between $F_{OSC}$ 214 count values and buffer impedance may be established as a correlation between $F_{OSC}$ 214 and PVT control bit values 216. The correlation between $F_{OSC}$ 214 count values and PVT control bit values 216 may then be put into a look-up table that is stored as a predetermined look-up table in the digital system 204. The digital system 204 may then use the count of $F_{OSC}$ 214 oscillations accumulated during a desired count period as an input to the look-up table to obtain a correlating PVT control bit value 216 to provide to the overall IO interface so the IO interface may adjust the buffer impedance of the IO interface accordingly.

Figure 3:
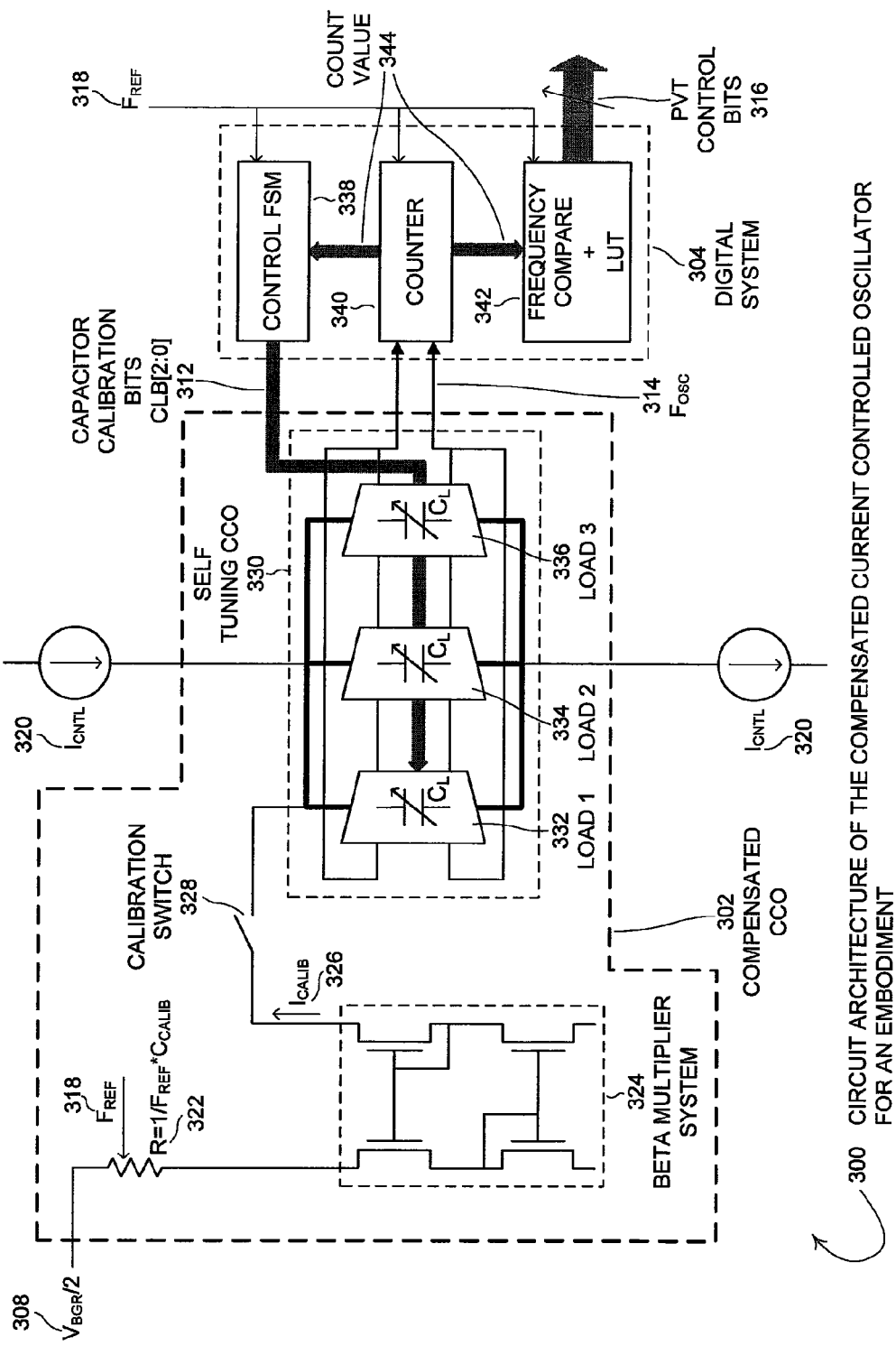
FIG. 3 is a circuit architecture block diagram of the compensated current controlled oscillator for an embodiment showing details of a capacitor calibration embodiment for the compensated current controlled oscillator.

FIG. 3 is a circuit architecture block diagram 300 of the compensated current controlled oscillator 302 for an embodiment showing details of a capacitor calibration embodiment for the compensated current controlled oscillator 302. FIG. 3 shows additional detail of the self-tuning current controlled oscillator 330 as well as the calibration portions of the compensated current controlled oscillator 302. There is also a further breakdown of functionality of the digital system 304 for an embodiment that may be utilized by the embodiment to carry out the functions of the digital system 304. As may be seen in the self tuning current controlled oscillator, the capacitance loads $C_L$ 332-336 are connected in a ring structure to create the current controlled oscillator. When calibration electrical switch 328 is open, an embodiment may operate as previously described. During a calibration state/operation, the calibration electrical switch 328 may be closed engaging the circuit of the beta-multiplier 324 and capacitor resistor 322. The capacitor resistor is a frequency varying resistor that may vary in value as a function of frequency received at a frequency input for the resistor 322 and the capacitance ($C_{CALIB}$) of the self tuning current controlled oscillator 330 during the calibration operation. To calibrate the self tuning current controlled oscillator 330, $F_{REF}$ may be connected to the frequency input of the capacitor resistor (R) 322. A first end of capacitor resistor (R) 322 may be connected to $V_{BGR}/2$ (308) and a second end may be connected to a beta multiplier system 324. Accordingly, the value of the capacitor resistor (R) 322 during calibration may, therefore, be found using Eq. 5 below.

$$R = \frac{1}{F_{REF} * C_{CALIB}} \quad \text{Eq. 5}$$

The beta-multiplier 324 may have a gain of one, or unity, such that the calibration current ($I_{CALIB}$) 326 may be found using Eq. 6 below.

$$I_{CALIB} = \frac{V}{R} = \frac{V_{BGR}}{2} * F_{REF} * C_{CALIB} \quad \text{Eq. 6}$$

The $I_{CALIB}$ 326 current may be used to determine the current value of $C_L$ of the loads 332-226 of the self tuning current controlled oscillator 330 using Eq. 7 below.

$$\frac{\Delta F}{F_{OSCNominal}} = \frac{2 * \Delta C_L}{C_{LNominal}} \quad \text{Eq. 7}$$

which may be updated to Eq. 8 below for the current value of $C_L$ during the calibration process.

$$C_{CALIB} = C_{LNominal} + \frac{\Delta F * C_{LNominal}}{2 * F_{OSCNominal}} \quad \text{Eq. 8}$$

$F_{OSCNominal}$ and $C_{LNominal}$ are simulation determined values at a nominal process corner. Using the difference between $F_{OSCNominal}$ and $F_{OSC}$ 314 along with $F_{OSCNominal}$ and $C_{LNominal}$, the digital system 304 is able to calculate the current $C_{CALIB}$ of the self tuning current controlled oscillator 330, and then send appropriate capacitor calibration bits 312 to the self tuning current controlled oscillator 330 to tune process variation out of the capacitor loads $C_L$ 332-336.

The digital system 304 of the embodiment illustrated in FIG. 3 shows three subsystems of the digital system 304. An embodiment may implement a control Finite State Machine (FSM) 338 to handle the state control of the system, such as power-on, calibration, normal operation, etc. As described above, during normal operation calibration electrical switch 328 would be open and during calibration (which will typically occur at least at the power up state), calibration electrical switch 328 would close causing the self tuning current controlled oscillator to be controlled by $I_{CALIB}$ 326 instead of $I_{CNTL}$ 320 (which is proportional to $I_{PVT}$). During either calibration or normal operation, the counter/accumulator 340 would determine count values 344 for $F_{OSC}$ 314 and deliver the count values 344 to the control FSM 338 (possibly for use in calibrating the self tuning CCO 330) and to the frequency compare plus Look-Up Table (LUT) 342 (possibly for use in looking up desired PVT control bit values 316 during normal operation).

Figure 4A:
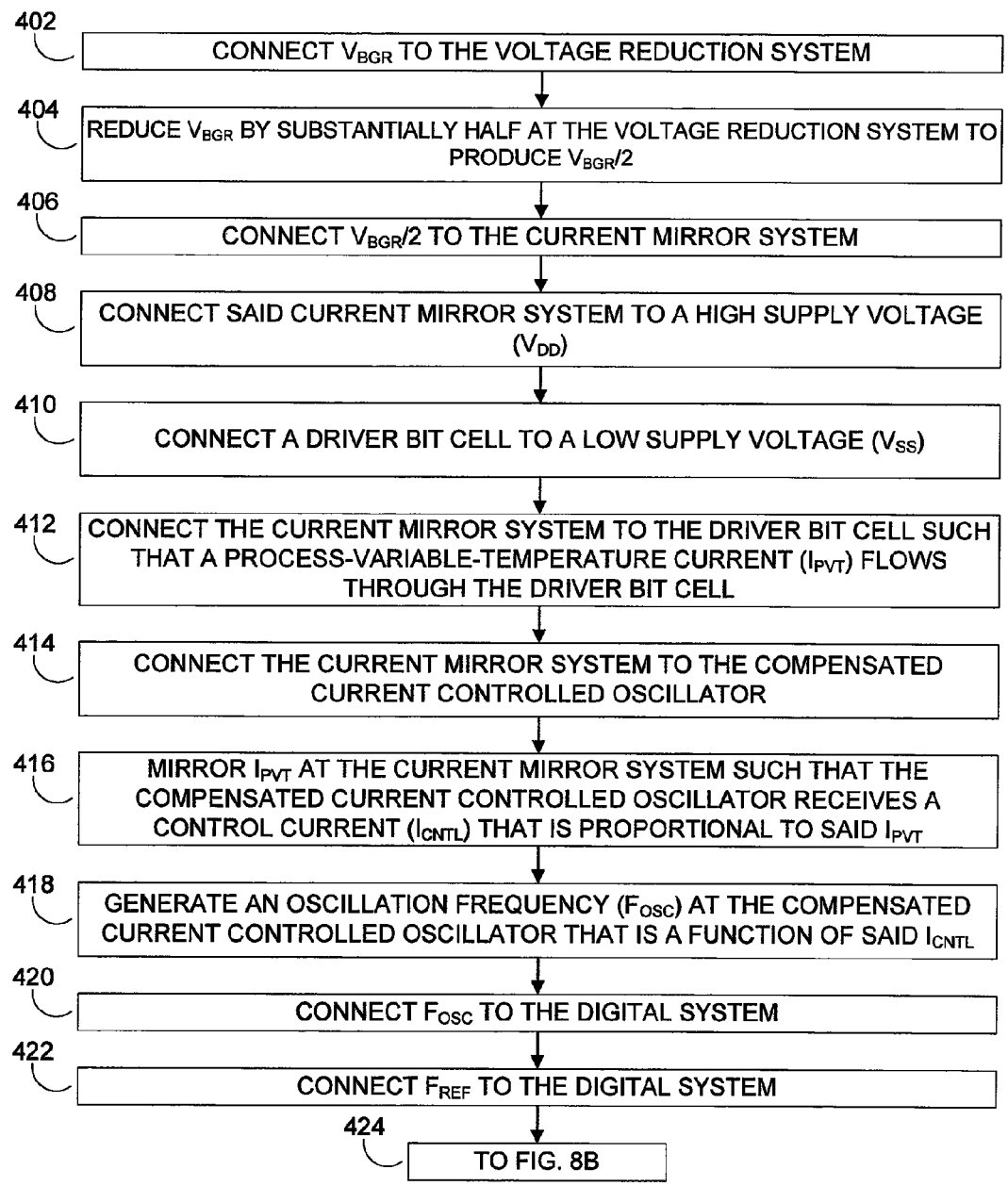
FIG. 4A is a flow chart of the process of connecting and operating an embodiment of an external component-less PVT compensation circuit, with particular regard to the analog section of the embodiment.

FIG. 4A is a flow chart 400 of the process of connecting and operating an embodiment of an external component-less PVT compensation circuit, with particular regard to the analog section of the embodiment. At process 402, $V_{BGR}$ is connected to the input of a voltage reduction system. At process 404, the voltage reduction system reduces $V_{BGR}$ by substantially half to produce $V_{BGR}/2$. At process 406, $V_{BGR}/2$ at the output of the voltage reduction system is connected to an input of the current mirror system. At process 408, a high voltage supply connection point of the current mirror system is connected to the high supply voltage ($V_{DD}$) of the IO interface circuit. At process 410, one end of a driver bit cell is connected to ground/low supply voltage (VSS). At process 412, the primary current output of the current mirror system is connected to the other end of the driver bit cell such that a PVT current ($I_{PVT}$) flows through the driver bit cell. At process 414, a mirrored current output of the current mirror system is connected to the compensated current controlled oscillator. At process 416, the current mirror system mirrors $I_{PVT}$ on the mirrored current output of the current mirror system such that the compensated current controlled oscillator receives a control current ($I_{CNTL}$) that is proportional to $I_{PVT}$. For ease of operation/design, a one-to-one proportion may be chosen for an embodiment, but other linearly dependent proportional relationships may be used if so desired by a system designer. At process 418, the compensated current controlled oscillator generates an oscillation frequency ($F_{OSC}$) that is a function of $I_{CNTL}$ (which is substantially linearly proportional to $I_{PVT}$). Via calibration of the compensated current controlled oscillator to remove process variation of the comb/fringe capacitors and choice of materials of the comb/fringe capacitors to limit voltage and temperature variations, the frequency $F_{OSC}$ of the current controlled oscillator may be substantially linearly dependent on the input $I_{CNTL}$. At process 420, the $F_{OSC}$ signal generated by the compensated current controlled oscillator is connected to a frequency input of the digital system. At process 422, the $F_{REF}$ signal from the IO interface circuit is connected to a reference frequency input of the digital system. Off page connector 424 directs the process to FIG. 4B on a separate drawing sheet.

Figure 4B:
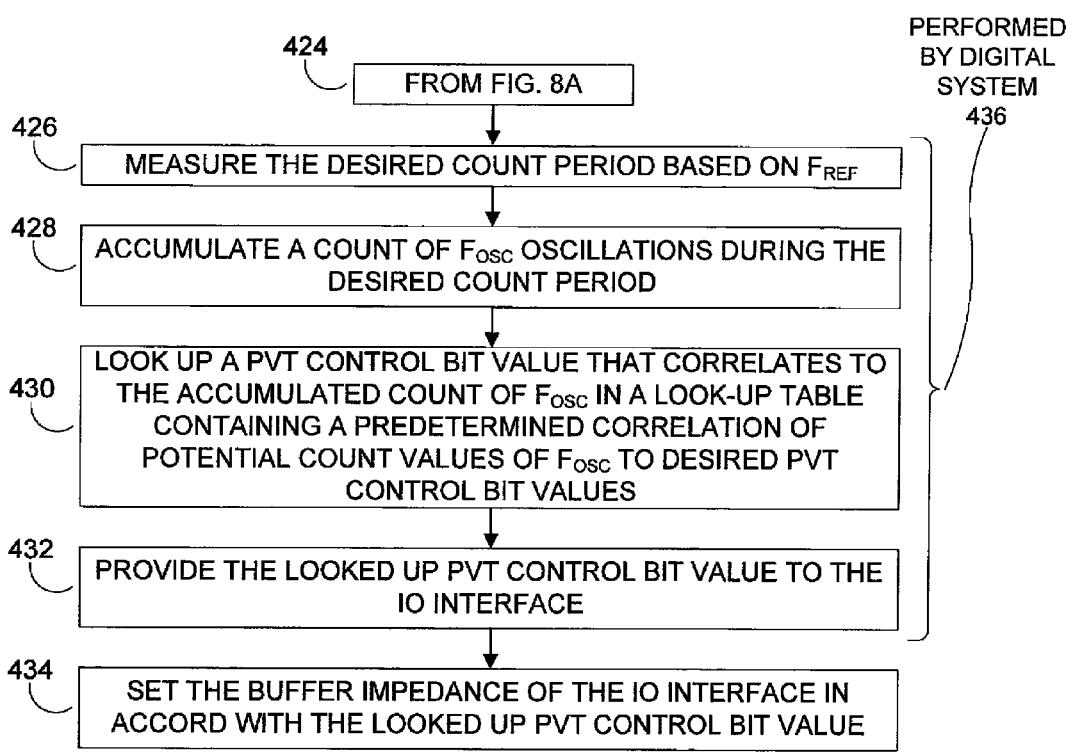
FIG. 4B is a flow chart of a process of connecting and operating an embodiment of an external component-less PVT compensation circuit, with particular regard to the digital section of the embodiment.

FIG. 4B is a flow chart 450 of the process of connecting and operating an embodiment of an external component-less PVT compensation circuit, with particular regard to the digital section of the embodiment. Off page connector 424 indicates that the flow chart 450 is a continuation from FIG. 4A on a separate drawing sheet. At process 426, a desired count period for accumulating a count of $F_{OSC}$ oscillations is measured by the digital system based on the known $F_{REF}$. At process 428, an accumulator/counter of the digital system counts the oscillations of $F_{OSC}$ during a desired count period. At process 430, the digital system looks up a PVT control bit value that correlates to the accumulated count of $F_{OSC}$ in a look-up table that contains a predetermined correlation of potential count values of $F_{OSC}$ to desired PVT control bit values. At process 432, the digital system provides the looked up PVT control bit value to the IO interface. At process 434, the IO interface sets the buffer impedance of the IO interface in accord with the looked up PVT control bit value. As noted at 436, processes 426-432 may be performed by the digital system of an embodiment.

Figure 5:
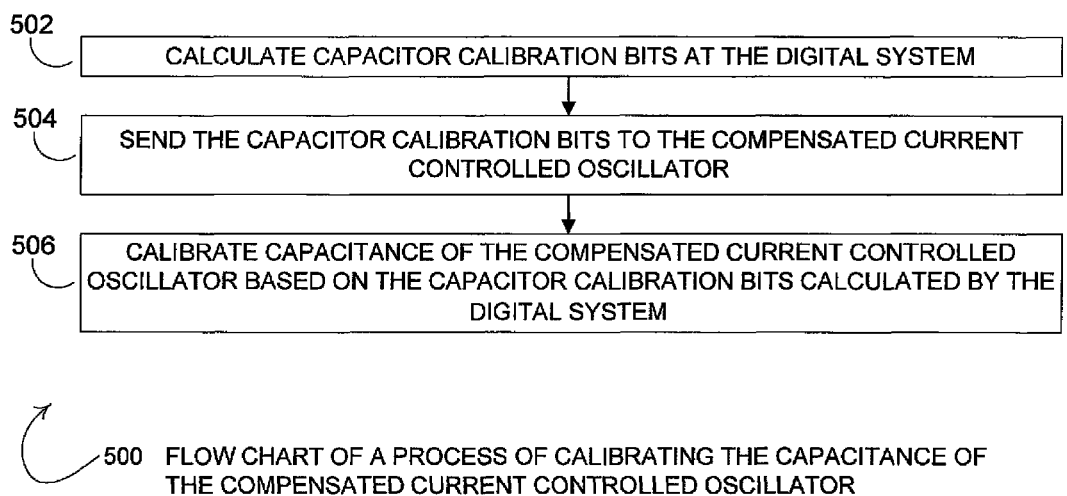
FIG. 5 is a flow chart of a process of calibrating the capacitance of the compensated current controlled oscillator for an embodiment.

FIG. 5 is a flow chart 500 of the process of calibrating the capacitance of the compensated current controlled oscillator. At process 502, the digital system may calculate capacitor calibration bits to compensate for process variation of the comb/fringe capacitors of the compensated current controlled oscillator. At process 504, the calculated capacitor calibration bits are sent to the compensated current controlled oscillator from a calibration bits output of the digital system to a calibration bits input of the compensated current controlled oscillator. Notably, for the calibration bits to have any effect on the operation of the compensated current controlled oscillator, the compensated current controlled oscillator should be "digitally" tunable. At process 506, the digitally tunable compensated current controlled oscillator calibrates the capacitance of the comb/fringe capacitors based on the capacitor calibration bits calculated by the digital system.

Figure 6:
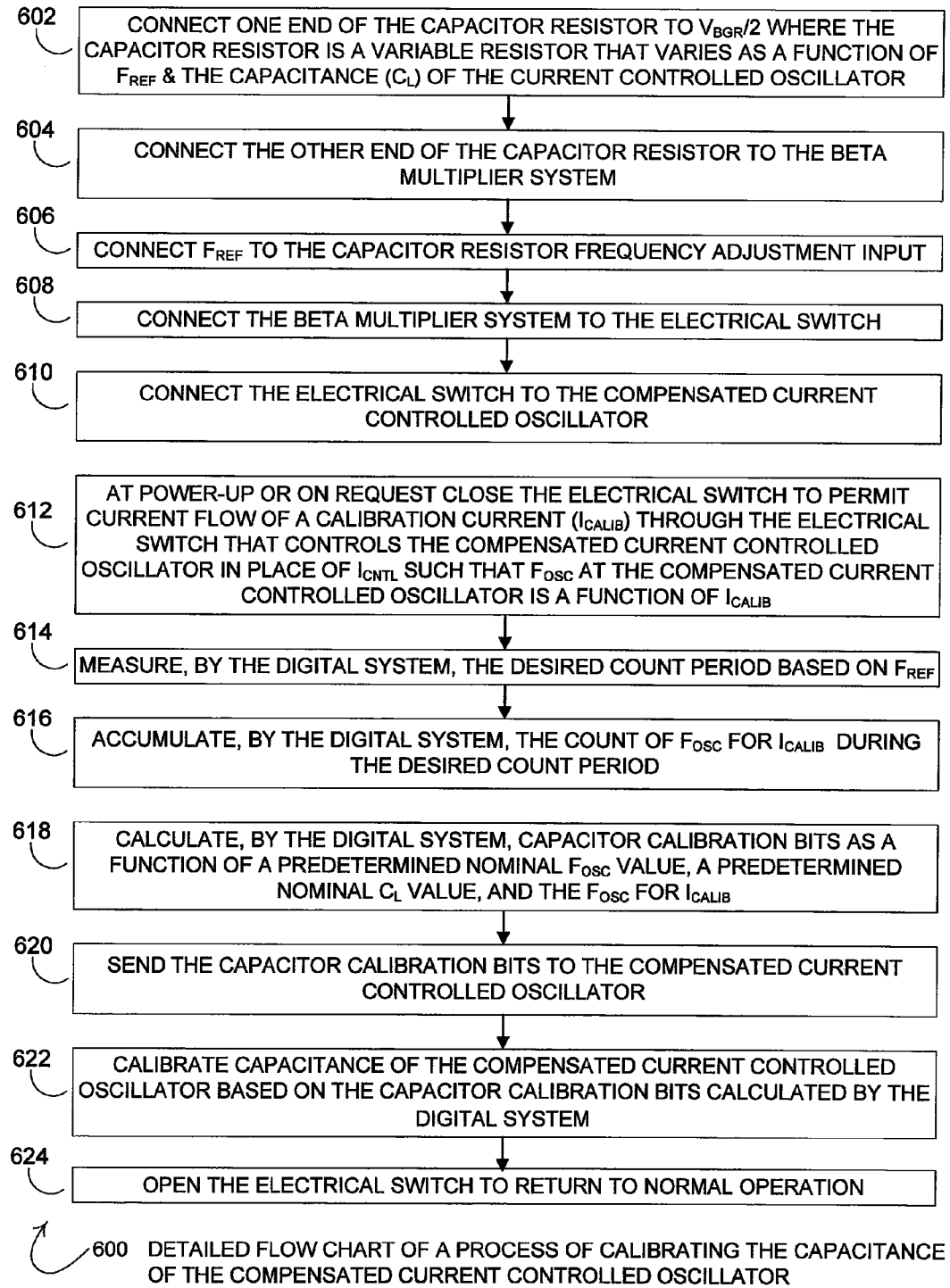
FIG. 6 is a detailed flow chart of the process of calibrating the capacitance of the compensated current controlled oscillator for an embodiment.

FIG. 6 is a detailed flow chart of a process of calibrating a capacitance of the compensated current controlled oscillator for an embodiment. At process 602, one end of the capacitor resistor (R) is connected to $V_{BGR}/2$. The capacitor resistor may be a variable resistor that varies as a function of $F_{REF}$ and the capacitance ($C_L$) of the compensated current controlled oscillator. At process 604, the other end of the capacitor resistor (R) is connected to the beta-multiplier. At process 606, $F_{REF}$ is connected to a frequency adjustment input to the capacitor resistor. At process 608, the other side of the beta-multiplier is connected to a calibration electrical switch. The gain/K value for the beta-multiplier system is preferably one, or unity, for system simplicity, but this is not required. At process 610, the other side of the calibration electrical switch is connected to the compensated current controlled oscillator. At process 612, typically on overall IO interface power-up (i.e., start) and/or upon a specific request, the calibration electrical switch is closed causing the system to enter a calibration state where a calibration current $I_{CALIB}$ flows through the calibration electrical switch such that $I_{CALIB}$ controls the compensated current controlled oscillator in place of $I_{CNTL}$, and $F_{OSC}$ at the compensated current controlled oscillator is a function of $I_{CALIB}$. At process 614, a desired count period for accumulating a count of $F_{OSC}$ oscillations is measured by the digital system based on the known $F_{REF}$. At process 616, an accumulator/counter of the digital system counts the oscillations of $F_{OSC}$ during a desired count period. At process 618, the digital system calculates capacitor calibration bits as a function of a predetermined nominal $F_{OSC}$ value, a predetermined nominal $C_L$ value, and the counted $F_{OSC}$ value for ICALIB. The relationship among the variables is substantially the same as described in Eqs. 5-8 in the discloser above with respect to FIG. 3. At process 620, the calculated capacitor calibration bits are sent to the compensated current controlled oscillator from a calibration bits output of the digital system to a calibration bits input of the compensated current controlled oscillator. Notably again, for the calibration bits to have any effect on the operation the compensated current controlled oscillator, the compensated current controlled oscillator should be "digitally" tunable. At process 622, the digitally tunable compensated current controlled oscillator calibrates the capacitance of the comb/fringe capacitors based on the capacitor calibration bits calculated by the digital system. At process 624, the calibration electrical switch is opened and system operation is returned to normal PVT compensation operation.

Various embodiments may be implemented using components that have substantially electrically similar characteristics. For instance, in place of one resistor, multiple resistors may be included that together have the same resistance characteristics as the resistors described herein.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:
1. A method to provide Process-Voltage-Temperature (PVT) compensation for an Input/Output (IO) interface, said IO interface having a bandgap reference voltage ($V_{BGR}$) and a reference frequency ($F_{REF}$), said method comprising:
  connecting said $V_{BGR}$ to a voltage reduction system;
  reducing said $V_{BGR}$ by substantially half at said voltage reduction system to produce $V_{BGR}/2$;

connecting said $V_{BGR}/2$ to a current mirror system;

connecting said current mirror system to a high supply voltage ($V_{DD}$);

connecting a driver bit cell to a low supply voltage ($V_{SS}$);

connecting said current mirror system to said driver bit cell such that a process-variable-temperature current ($I_{PVT}$) flows through said driver bit cell;

connecting said current mirror system to a compensated current controlled oscillator;

mirroring said $I_{PVT}$ at said current mirror system such that said compensated current controlled oscillator receives a control current ($I_{CNTL}$) that is proportional to said $I_{PVT}$;

generating an oscillation frequency ($F_{OSC}$) at said compensated current controlled oscillator that is a function of said $I_{CNTL}$;

connecting said $F_{OSC}$ to a digital system;

connecting said $F_{REF}$ to said digital system;

measuring, by said digital system, a desired count period based on $F_{REF}$;

accumulating, by said digital system, a count of said $F_{OSC}$ at said digital system during said desired count period;

looking up, by said digital system, a PVT control bit value that correlates to said accumulated count of said $F_{OSC}$ in a look-up table containing a predetermined correlation of potential count values of said $F_{OSC}$ to desired PVT control bit values; and providing, by said digital system, said looked up PVT control bit value to said IO interface.

2. The method of claim 1 further comprising:

calculating, by said digital system, capacitor calibration bits;

sending said capacitor calibration bits to said compensated current controlled oscillator; and calibrating capacitance of said compensated current controlled oscillator based on said capacitor calibration bits calculated by said digital system.

3. The method of claim 2 wherein said process of calibrating said compensated current controlled oscillator based on said capacitor calibration bits calculated by said digital system tunes said compensated current controlled oscillator such that said $F_{OSC}$ of said compensated current controller oscillator is substantially linearly dependent on said $I_{CNTL}$, and further comprising digitally subtracting out an effect of channel length modulation of PMOS and NMOS devices in said compensated current controlled oscillator from said accumulated count value prior to said process of looking of said PVT control bit value.

4. The method of claim 2 wherein said process of calculating capacitor calibration bits by said digital system further comprises:

connecting a first end of a capacitor resistor to said $V_{BGR}/2$, said capacitor resistor being a variable resistor that varies as a function of $F_{REF}$ and of capacitance ($C_L$) of said compensated current controlled oscillator;

connecting a second end of said capacitor resistor to a beta multiplier system;

connecting $F_{REF}$ to a frequency adjustment input of said capacitor resistor;

connecting said beta multiplier system to an electrical switch;

connecting said electrical switch to said compensated current controlled oscillator;

closing said electrical switch to permit current flow of a calibration current ($I_{CALIB}$) through said electrical switch that controls said compensated current controlled oscillator in place of said $I_{CNTL}$ such that said $F_{OSC}$ at said compensated current controlled oscillator is a function of $I_{CALIB}$;

measuring, by said digital system, said desired count period based on $F_{REF}$;

accumulating, by said digital system, said count of said $F_{OSC}$ for said $I_{CALIB}$ at said digital system during said desired count period;

calculating, by said digital system, capacitor calibration bits as a function of a predetermined nominal $F_{OSC}$ value, a predetermined nominal $C_L$ value, and said $F_{OSC}$ for $I_{CALIB}$.

5. The method of claim 4 wherein said process of calculating capacitor calibration bits by said digital system further comprises:

simulating operation of said compensated current controlled oscillator at a nominal process corner; and predetermining said predetermined nominal $F_{OSC}$ value and said predetermined nominal $C_L$ value based on said simulated operation at said nominal process corner.

6. The method of claim 4 wherein said process of calculating capacitor calibration bits by said digital system further comprises closing said switch to perform said calculations of capacitor calibration bits at a power-on state of said IO interface or when a compensated current controlled oscillator calibration is requested during operation.

7. The method of claim 1 further comprising setting, by said IO interface, a buffer impedance of said IO interface in accord with said looked up PVT control bit value.

8. The method of claim 1 further comprising:

simulating operation of said compensated current controlled oscillator from a slow process corner to a fast process corner in discrete steps correlating to each count in a range of accumulated counts during said desired count period;

correlating each count in said range of accumulated counts to a desired PVT control bit value; and storing each count in said range of accumulated counts and said desired PVT control bit value correlating to each count in said range of accumulated counts in said look-up table containing said predetermined correlation of potential count values of said $F_{OSC}$ to desired PVT control bit values.

9. The method of claim 1 wherein said voltage reduction system is an op-amp loop and said method of claim 1 further comprises:

connecting said $V_{BGR}$ to a positive input of an operational amplifier of said op-amp loop;

connecting a negative input of said operational amplifier of said op-amp loop to said connection between said current mirror system and said driver bit cell; and setting a gain of said operational amplifier such that an output of said operational amplifier is at substantially said $V_{BGR}/2$.

10. The method of claim 1 wherein said process of mirroring said $I_{PVT}$ at said current mirror system such that said compensated current controlled oscillator receives said $I_{CNTL}$ that is proportional to said $I_{PVT}$ makes said $I_{CNTL}$ proportional to said $I_{PVT}$ on a substantially one-to-one basis.

11. A Process-Voltage-Temperature (PVT) compensation system for an Input/Output (IO) interface, said IO interface having a bandgap reference voltage ($V_{BGR}$) and a reference frequency ($F_{REF}$), said PVT compensation system comprising:

a voltage reduction subsystem connected to said $V_{BGR}$ that reduces said $V_{BGR}$ by substantially half to produce $V_{BGR}/2$;

a driver bit cell connected to a current mirror subsystem and to a low supply voltage ($V_{SS}$);

said current mirror subsystem connected to said $V_{BGR}/2$, to a high supply voltage ($V_{DD}$), to said driver bit cell, and to a compensated current controlled oscillator such that a process-variable-temperature current ($I_{PVT}$) flows through said driver bit cell and a mirrored control current ($I_{CNTL}$) that is proportional to said $I_{PVT}$ is delivered to said compensated current controlled oscillator;

a compensated current controlled oscillator connected to said $I_{CNTL}$ that generates an oscillation frequency ($F_{OSC}$) that is a function of said $I_{CNTL}$;

a digital subsystem that is connected to said $F_{OSC}$ and to said $F_{REF}$, and that measures a desired count period based on $F_{REF}$, accumulates a count of said $F_{OSC}$ during said desired count period, looks up a PVT control bit value that correlates to said accumulated count of said $F_{OSC}$ in a look-up table containing a predetermined correlation of potential count values of said $F_{OSC}$ to desired PVT control bit values, and provides said looked up PVT control bit value to said IO interface in order for said IO interface to set a buffer impedance of said IO interface in accord with said looked up PVT control bit value.

12. The Process-Voltage-Temperature (PVT) compensation system of claim 11 wherein said digital subsystem further calculates capacitor calibration bits and sends said capacitor calibration bits to said compensated current controlled oscillator, and, wherein said compensated current controlled oscillator calibrates capacitance of said compensated current controlled oscillator based on said capacitor calibration bits calculated by said digital system.

13. The Process-Voltage-Temperature (PVT) compensation system of claim 1 wherein said compensated current controlled oscillator is calibrated to tune said compensated current controlled oscillator such that said $F_{OSC}$ of said compensated current controller oscillator is substantially linearly dependent on said $I_{CNTL}$, and wherein said digital subsystem digitally subtracts out an effect of channel length modulation of PMOS and NMOS devices in said compensated current controlled oscillator from said accumulated count value prior to looking up said PVT control bit value.

14. The Process-Voltage-Temperature (PVT) compensation system of claim 12 wherein said digital subsystem calculation of capacitor calibration bits further comprises:

a capacitor resistor connected at a first end of a capacitor resistor to said $V_{BGR}/2$, at a second end of said capacitor resistor to a beta multiplier subsystem, and at a frequency adjustment input of said capacitor resistor to $F_{REF}$, said capacitor resistor being a variable resistor that varies as a function of $F_{REF}$ and of capacitance ($C_L$) of said compensated current controlled oscillator;

said beta multiplier subsystem connected to said capacitor resistor and to an electrical switch;

said electrical switch connected between said beta multiplier subsystem and said compensated current controlled oscillator such that when said electrical switch is closed a calibration current ($I_{CALIB}$) flows through said electrical switch such that said $I_{CALIB}$ controls said compensated current controlled oscillator in place of said $I_{CNTL}$ and said $F_{OSC}$ at said compensated current controlled oscillator is a function of $I_{CALIB}$; and wherein said digital system measures said desired count period based on $F_{REF}$, accumulates said count of said $F_{OSC}$ for said $I_{CALIB}$ during said desired count period, and calculates capacitor calibration bits as a function of a predetermined nominal $F_{OSC}$ value, a predetermined nominal $C_L$ value, and said $F_{OSC}$ for $I_{CALIB}$.

15. The Process-Voltage-Temperature (PVT) compensation system of claim 11 wherein said voltage reduction system is one of a group consisting of: an op-amp loop and a voltage divider circuit.

16. The Process-Voltage-Temperature (PVT) compensation system of claim 11 wherein said voltage reduction system is an op-amp loop, and wherein said op-amp loop further comprises an operational amplified that is connected to said $V_{BGR}$ at a positive input of said operational amplifier and to said connection between said current mirror system and said driver bit cell at a negative input of said operational amplifier of said op-amp, and a gain of said operational amplifier is set such that an output of said operational amplifier is at substantially said $V_{BGR}/2$.

17. The Process-Voltage-Temperature (PVT) compensation system of claim 1 wherein said current mirror subsystem makes said $I_{CNTL}$ proportional to said $I_{PVT}$ on a substantially one-to-one basis.

18. The Process-Voltage-Temperature (PVT) compensation system of claim 11 wherein said compensated current controlled oscillator is comprised of a plurality of comb/fringe capacitors implemented using metal structures having substantially negligible voltage and temperature coefficients, said plurality of comb/fringe capacitors connected in a ring oscillator structure, said compensated current controlled oscillator also being digitally tunable.

19. The Process-Voltage-Temperature (PVT) compensation system of claim 11 wherein said IO interface does not require an external precision resistor to perform PVT compensation.

20. The Process-Voltage-Temperature (PVT) compensation system of claim 11 wherein said $V_{SS}$ is substantially electric ground.

* * * * *